United States Patent [19]

Yamashiro et al.

[11] 4,020,367

[45] Apr. 26, 1977

[54] CONSTANT-CURRENT CIRCUIT

[75] Inventors: Osamu Yamashiro; Shunji Shimada, both of Kodaira, Japan

[73] Assignee: Hitachi, Ltd., Japan

[22] Filed: May 18, 1976

[21] Appl. No.: 687,510

[30] Foreign Application Priority Data

May 28, 1975 Japan .............................. 50-62869

[52] U.S. Cl. ................................ 307/297; 307/304; 323/4; 323/22 R

[51] Int. Cl.² ....................... H02J 1/04; G05F 1/52; H03K 1/12

[58] Field of Search .................. 307/296, 297, 304; 323/1, 4, 22 R, 22 T

[56] References Cited

UNITED STATES PATENTS

| | | | |
|---|---|---|---|
| 3,806,742 | 4/1974 | Powell | 307/304 |
| 3,813,595 | 5/1974 | Sheng | 323/4 |
| 3,875,430 | 4/1975 | Prak | 307/297 |

OTHER PUBLICATIONS

Hoffman, "Constant–Current Source for Mosfet Circuits;" IBM Tech. Discl. Bull.; vol. 17, No. 8, p. 2391; 1/1975.

*Primary Examiner*—John S. Heyman
*Assistant Examiner*—Larry N. Anagnos
*Attorney, Agent, or Firm*—Craig & Antonelli

[57] ABSTRACT

A constant-current circuit comprising a first enhancement type FET, a depletion type FET having its drain and source connected to the drain and gate of the first enhancement type FET respectively, a second enhancement type FET having its drain and source connected to the gate and source of the first enhancement type FET and a series connection of two impedance elements having its ends connected to the source of the depletion type FET and to the source of the second enhancement type FET, the juncture between the two impedance elements being connected to the gate of the second enhancement type FET, whereby the constant-current characteristics of such constant-current circuits are checked from being dispersed.

5 Claims, 5 Drawing Figures

CONSTANT-CURRENT CIRCUIT

The present invention relates to a constant-current circuit, and more particularly it is devoted to a constant-current circuit which is constructed of insulated gate field-effect transistors (hereinbelow, simply termed FETs).

In general, in semiconductor integrated circuits constructed of FETs, it is common that the whole circuit is fabricated of enhancement type FETs. However, an integrated circuit which is excellent in the delay time and in the power factor becomes possible by applying a depletion type FET as a load. This is described in, for example, a Japanese periodical "Denshi Zairyo (Electronic Material)", April 1971, pp. 52–54.

In case of empolying the load element as a resistance R which determines the CR-time constant of an oscillation circuit constructed of FETs, the charging characteristic is not changed even by a fluctuation in the supply voltage and the oscillation frequency is stabilized because the load element has a constant-current characteristic.

A current I flowing through the load element, however, is represented by the following equation (1) and varies largely on account of the dispersion of the threshold voltage Vth being a process parameter.

$$I = 1/2\ \beta\ Vth^2 \qquad (1)$$

Where $\beta$ denotes the channel conductivity to 1 V of the gate voltage, and Vth the threshold voltage.

However, it is known that the threshold voltage of a depletion type FET changes with the manufacturing process and it is difficult to obtain depletion type FETs of identical threshold quality. Therefore, a saturation current of the depletion type FET may differ from one depletion type FET to another. Accordingly, the constant-current circuits using the depletion type FETs do not always have the same characteristics. Furthermore, this type of constant-current circuit is not stabilized against the change in ambient temperature. As a result, the oscillator using the above constant-current circuit has a drawback of variation of the oscillation frequency due to the above factors.

It is the primary object of the present invention to provide constant-current circuits having almost identical constant-current characteristics independently of the manufacturing process.

It is another object of the present invention to provide constant-current circuits having almost identical constant current characteristics independent of the manufacturing process and is further stabilized against the change in ambient temperature.

The foregoing and other objects and advantages of the present invention will be apparent from the following detailed description of the preferred embodiments of the present invention made in conjunction with the accompanying drawings, in which.

Figure 1:
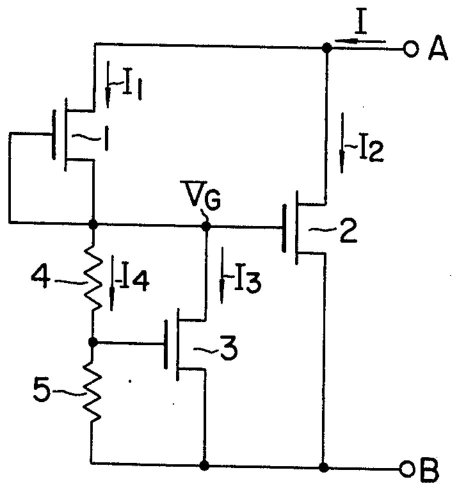
FIG. 1 is a circuit diagram illustrating one embodiment of the present invention.

Referring now to FIG. 1 showing a circuit diagram of a first embodiment of the constant-current circuit in accordance with the present invention, an FET 1, which is of depletion type, has its drain connected to a D.C. supply terminal A, an FET 2 which is of enhancement type, has its drain connected to the terminal A and its gate connected to the gate and source of the FET 1 and its source connected to a D.C. supply terminal B. An FET 3, which is of enhancement type, has its drain connected to the gate of the FET 2 and its source connected to the terminal B. An impedance element 4 such as a resistor element is connected between the drain and gate of the FET 3. Another impedance element 5 such as a resistor element is connected between the gate and source of the FET 3. It is assumed that a current $I_1$ flows through the drain-source circuit of the FET 1, a current $I_2$ flows through the drain-source circuit of the FET 2, a current $I_3$ flows through the drain-source circuit of the FET 3 and a current $I_4$ flows through the resistor elements 4 and 5. The following relations exist among the currents $I_1$ to $I_4$.

$$I_1 << I_2 \qquad (2)$$

$$I_3 >> I_4 \qquad (3)$$

Namely, the components are chosen such that the impedance of the FET 2 in its connection state is negligibly small as compared with the sum of the impedance of the FET 1 in its conduction state and the impedance of the parallel connection of the FET 3 in its conduction state and the series impedance of the resistor elements 4 and 5, and the impedance of the FET 3 in its conduction state is negligibly small as compared with the series impedance of the resistor elements 4 and 5.

On the other hand, the following relations exist among the currents $I_1$ to $I_4$.

$$I_1 = \tfrac{1}{2}\beta_1 V^2thd \qquad (4)$$

$$I_2 = \tfrac{1}{2}\beta_2 (V_G - Vthe)^2 \qquad (5)$$

$$I_3 = \tfrac{1}{2}\beta_3 \left(\frac{R_5}{R_4 + R_5} V_G - Vthe\right)^2 \qquad (6)$$

$$I_4 = \frac{V_G}{R_4 + R_5} \qquad (7)$$

$$I = I_1 + I_2 \qquad (8)$$

$$I_1 = I_3 + I_4 \qquad (9)$$

where

I: current flowing between terminals A and B, $\beta_1$, $\beta_2$, $\beta_3$: the channel conductivities of the FETs 1, 2 and 3 to 1V of the gate voltage, respectively, Vthd: threshold voltage of FET 1, Vthe: threshold voltage of FETs 2 and 3, $V_G$: voltage applied to the gate of FET 2, $R_4$, $R_5$: impedances of resistor elements 4 and 5.

From equations (3) and (9), $$I_1 \simeq I_3 \qquad (10)$$

is derived. Accordingly, from equations (4), (6) and (10), $V_G$ is expressed by:

$$V_G = \frac{\sqrt{\beta_1/\beta_3} \cdot Vthd + Vthe}{R_5/(R_4 + R_5)} \qquad (11)$$

Putting $\sqrt{\beta_1/\beta_3} = \beta$ and $R_5/(R_4 + R_5) = \alpha$ into equation (11), $$V_G = \frac{\beta\, Vthd + Vthe}{\alpha} \qquad (11')$$

On the other hand, from equations (2) and (8), $$I \simeq I_2 \qquad (12)$$

is derived. Accordingly, from equations (5), (11') and (12), I is expressed by:

$$I = \tfrac{1}{2}\beta_2 \left\{ \frac{(1-\alpha)Vthe + \beta\, Vthd}{\alpha} \right\}^2 \qquad (13)$$

If the resistor elements 4 and 5 and the FET 2 and/or FET 3 are selected to satisfy $1-\alpha = \beta$, then $$I = \tfrac{1}{2}\beta_2 \left\{ \frac{1-\alpha}{\alpha}\,(Vthe + Vthd) \right\}^2 \qquad (13')$$

is derived. Consequently, the current I is independent of the voltage applied across the terminals A and B.

When the resistor elements 4 and 5 are constituted by FETs, term $(1-\alpha)/\alpha$ in equation (13') is determined by the channel length and the channel width of the FETs. There is little variance of those factors due to manufacturing process.

Figure 3:
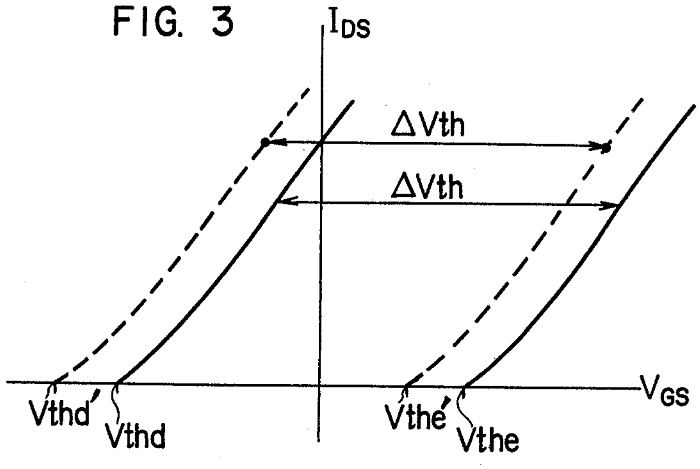
FIGS. 3 and 4 are diagrams of the $V_{GS}$-$I_{DS}$ characteristic curves, respectively.

Furthermore, the channel of a depletion type FET 1 is formed by ion implantation. Therefore (Vthe + Vthd) (= ΔVth) in Eq. (13') is a value which is determined by the quantity of the ion implantation in the process of manufacturing the integrated circuit. Even when Vthe and Vthd have dispersions in the manufacture, the dispersions occur complementarily, and the fluctuations of their sum (Vthe + Vthd) (= ΔVth) can be made small as shown in FIG. 3. Also for the dispersion in the process, accordingly, the current value can be prevented from dispersing.

Figure 4:
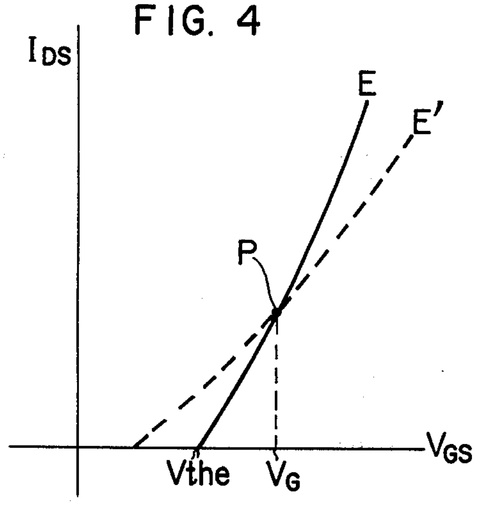

In addition, a temperature character of the enhancement type FET is generally shown in FIG. 4. In the FIG. 4, a curve E in solid line is the characteristic curve of the FET 2 at the normal temperature, while a curve E' shown by broken line is the characteristic curve of the FET 2 in the case where the temperature is made high. Point P is thus at which the temperaturedependency of the FET 2 is zero.

Accordingly, the gate voltage $V_G$ of the FET 2 is set such that the FET 2 exhibits zero temperature coefficient. This can be readily attained by properly selecting the values of $\beta_1$, $\beta_2$, Vthe, Vthd, $R_4$ and $R_5$. The $\beta_1$ is determined by the channel length and the channel width of the FET 1 and the $\beta_3$ is determined by the channel length and the channel width of the FET 3. Therefore, where the magnitude of $V_G$ has been set to assure zero temperature coefficient of the FET 2, the constant current characteristic is stabilized against the change in ambient temperature.

In this manner, a constant current flows, which is always stabilized against the change in supply voltage, in manufacturing process and in ambient temperature.

Figure 2:
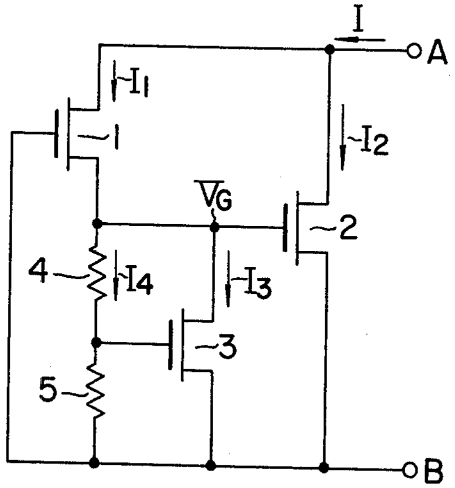
FIG. 2 is a circuit diagram illustrating another embodiment of the present invention.

FIG. 2 shows a second embodiment of the constant current circuit of the present invention. In FIG. 2, like numerals show identical parts as in FIG. 1 and they are not particularly explained here. In the present embodiment, the gate of the FET 1 is not connected to the source thereof but to the terminal B. The same function and advantage as those in FIG. 1 embodiment can be attained in the present embodiment.

Figure 5:
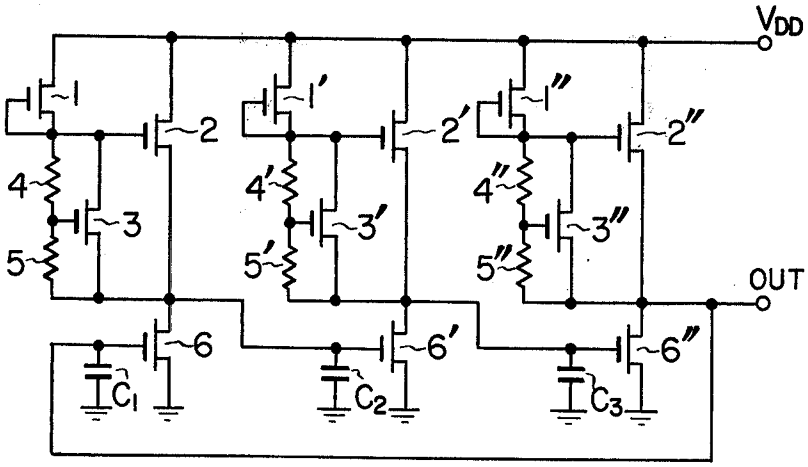
FIG. 5 is a circuit diagram showing an example in the case where this invention is applied to an oscillation circuit.

As described hereinabove, since the constant current circuit of the present invention is designed such that current $I_2$ flowing through the FET 2 is substantially larger than the current $I_1$ flowing through the FET 1 and the current $I_3$ flowing through the FET 3 is substantially larger than the current $I_4$ flowing through the impedance elements 4 and 5, the variation in the constant current characteristic due to a particular manufacturing process can be minimized. In addition, since the voltage applied to the gate of the FET 2 is set to a voltage which assures zero temperature coefficient of the FET 2, the constant-current characteristic can be stabilized against the change in ambient temperature.

Where the constant-current circuit according to this invention as described above is adapted as the constant-current load of an oscillation circuit as illustrated in FIG. 5, the suppression of the dispersion of the oscillation frequency and the stabilization of the oscillation frequency are achieved.

This invention is not restricted to the case of the used as such constant-current load of the oscillation circuit, but it can be generally and extensively utilized as the constant-current circuit. It will be readily understood that the resistance R may be any impedance means.

We claim:

1. A constant-current circuit comprising a depletion type FET having its drain adapted for connection to a bias source, first and second impedance means connected in series with each other, one end of the series connection of said first and second impedance means being connected to the source of said depletion type FET while the other end of the series connection of said first and second impedance means being adapted for connection to a common potential source, a first enhancement type FET having its drain and source connected to the drain of said depletion type FET and said other end of the series connection of said first and second impedance means respectively, and a second enhancement type FET having its gate and source connected to the juncture between said first and second impedance means and said other end of the series connection of said first and second impedance means respectively, the gate of said first enhancement type FET and the drain of said second enhancement type FET being connected to the juncture between the source of said depletion type FET and said one end of the series connection of said first and second impedance means, the impedance of said second enhancement type FET in conduction state being negligibly small in comparison with that of said series connection of said first and second impedance means, and the impedance of said first enhancement type FET in conduction state being negligibly small in comparison with the sum of the impedance of said depletion type FET in conduction state and the impedance of said series connection of said first and second impedance means.

2. A constant-current circuit according to claim 1, in which the impedances of said depletion type FET in conduction state and said first and second impedance means are such that in operation of the constant current circuit the potential on the juncture between the source of said depletion type FET and said one end of said first and second impedance means corresponds to a gate potential for said first enhancement type FET where the temperature coefficient of said first enhancement type FET is substantially zero.

3. A constant-current circuit according to claim 1, in which the gate of said depletion type FET is connected to the source of said depletion type FET.

4. A constant-current circuit according to claim 1, in which the gate of said depletion type FET is connected to said other end of said series connection of said first and second impedance means.

5. A constant-current circuit according to claim 1, in which each of said first and second impedance means is constituted by an FET arranged to serve as an impedance element.

* * * * *